(12) United States Patent
Chan et al.

(10) Patent No.: US 10,983,626 B2
(45) Date of Patent: Apr. 20, 2021

(54) ELECTRONIC DEVICES WITH DISPLAY AND TOUCH SENSOR STRUCTURES

(71) Applicant: Apple Inc., Cupertino, CA (US)

(72) Inventors: Isaac W. Chan, Sunnyvale, CA (US); Chun-Hao Tung, San Jose, CA (US); Fletcher R. Rothkopf, Los Altos, CA (US); Sunggu Kang, San Jose, CA (US); John Z. Zhong, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 510 days.

(21) Appl. No.: 15/159,074

(22) Filed: May 19, 2016

(65) Prior Publication Data

US 2016/0357318 A1     Dec. 8, 2016

Related U.S. Application Data

(60) Provisional application No. 62/171,634, filed on Jun. 5, 2015.

(51) Int. Cl.
    *G06F 3/043*           (2006.01)
    *G06F 3/041*           (2006.01)
    (Continued)

(52) U.S. Cl.
    CPC .......... *G06F 3/0416* (2013.01); *G06F 1/1626* (2013.01); *G06F 1/1643* (2013.01); *G06F 1/1652* (2013.01); *G06F 3/0412* (2013.01); *G06F 3/0445* (2019.05); *G06F 3/0446* (2019.05); *H01L 27/323* (2013.01);
    (Continued)

(58) Field of Classification Search
None
See application file for complete search history.

(56) References Cited

U.S. PATENT DOCUMENTS 5,680,233 A * 10/1997 Faris .................... H04N 13/337
                                                        349/61
8,929,085 B2     1/2015 Franklin et al.
(Continued)

FOREIGN PATENT DOCUMENTS

CN            102057342            5/2011
CN            202019376 U      10/2011
(Continued)

*Primary Examiner* — Carl Adams
(74) *Attorney, Agent, or Firm* — Treyz Law Group, P.C.; Kendall W. Abbasi

(57) ABSTRACT

Display layers and touch sensor layers may be overlapped by enclosure walls in an electronic device. The electronic device may have a front wall and opposing rear wall and curved sidewalls. The front wall and the curved sidewalls may be formed from a glass layer or other transparent member. A touch sensor layer and display layer may extend under the glass layer with curved sidewalls. A touch sensor layer may also extend under the opposing rear wall. A foldable electronic device may have a flexible transparent wall portion that joins planar transparent walls. Components may be interposed between the transparent planar walls and opaque walls. Display and touch layers may be overlapped by the transparent walls and the transparent flexible wall portion. Touch sensor structures may also be overlapped by the opaque walls.

27 Claims, 17 Drawing Sheets

(51) Int. Cl.
  *G06F 1/16* (2006.01)
  *G06F 3/044* (2006.01)
  *H01L 27/32* (2006.01)
  *H01L 51/52* (2006.01)
  *H01L 51/56* (2006.01)

(52) U.S. Cl.
  CPC .. *H01L 51/524* (2013.01); *G06F 2203/04102* (2013.01); *G06F 2203/04103* (2013.01); *H01L 51/56* (2013.01); *H01L 2251/5338* (2013.01)

(56) References Cited

U.S. PATENT DOCUMENTS

| | | | |
|---|---|---|---|
| 9,178,970 B2 | 11/2015 | Lynch | |
| 9,541,962 B2 | 1/2017 | Siddiqui | |
| 9,544,993 B2 | 1/2017 | Lee et al. | |
| 2006/0197750 A1 | 9/2006 | Kerr et al. | |
| 2009/0066663 A1* | 3/2009 | Chang | G06F 1/169 345/173 |
| 2010/0156887 A1 | 6/2010 | Lindroos et al. | |
| 2010/0277420 A1 | 11/2010 | Charlier et al. | |
| 2011/0012845 A1* | 1/2011 | Rothkopf | H05K 1/09 345/173 |
| 2011/0128241 A1 | 6/2011 | Kang et al. | |
| 2011/0234545 A1* | 9/2011 | Tanaka | G06F 3/0436 345/177 |
| 2013/0027364 A1* | 1/2013 | Kim | G06F 1/1616 345/204 |
| 2013/0033434 A1 | 2/2013 | Richardson et al. | |
| 2013/0328792 A1* | 12/2013 | Myers | G06F 3/0485 345/173 |
| 2014/0126121 A1* | 5/2014 | Griffin | H04M 1/0216 361/679.01 |
| 2014/0132481 A1 | 5/2014 | Bell et al. | |
| 2014/0139328 A1* | 5/2014 | Zellers | G06F 3/041 340/407.2 |
| 2014/0321072 A1 | 10/2014 | Cavallaro et al. | |
| 2015/0144921 A1 | 5/2015 | Lim et al. | |
| 2015/0296635 A1 | 10/2015 | Mycroft et al. | |
| 2016/0026219 A1* | 1/2016 | Kim | G06F 1/1652 345/173 |
| 2016/0026381 A1* | 1/2016 | Kim | G06F 3/04886 715/761 |
| 2016/0066440 A1 | 3/2016 | Choi et al. | |
| 2016/0139702 A1 | 5/2016 | Franklin et al. | |

FOREIGN PATENT DOCUMENTS

| | | |
|---|---|---|
| CN | 102750085 A | 10/2012 |
| CN | 103135844 | 6/2013 |
| CN | 103748538 | 4/2014 |
| CN | 104052838 | 9/2014 |
| CN | 104216543 A | 12/2014 |
| CN | 104375573 A | 2/2015 |
| CN | 104521331 | 4/2015 |
| EP | 2192750 A2 | 6/2010 |
| EP | 2725474 | 4/2014 |
| KR | 20140054746 A | 5/2014 |
| WO | 2015126497 | 8/2015 |

\* cited by examiner

ELECTRONIC DEVICES WITH DISPLAY AND TOUCH SENSOR STRUCTURES

This application claims the benefit of provisional patent application No. 62/171,634, filed Jun. 5, 2015, which is hereby incorporated by reference herein in its entirety.

BACKGROUND

This relates generally to electronic devices, and, more particularly, to electronic devices with touch sensors and displays.

Electronic devices such as cellular telephones, tablet computers, watches, laptop computers, and other devices often contain displays. Touch sensors may be used to provide displays with the ability to capture touch input from a user.

It can be challenging to gather touch input from a user and to display images for a user efficiently. For example, when a user supplies touch input to a touch screen display, the user's hand may block images that are being displayed on the display. Buttons and other input devices may be used to gather input from a user, but this type of input device may not be as convenient and versatile as a touch sensor. Displays are sometimes not visible from certain directions and may be smaller than desired.

It would therefore be desirable to be able to provide electronic devices with enhanced touch sensor and display structures.

SUMMARY

An electronic device may have an enclosure with walls formed from transparent and opaque materials. Display layers may be mounted under transparent portions of the walls. Touch sensor layers may be mounted under opaque and transparent wall portions.

The electronic device may have a front wall and opposing rear wall. Sidewalls may extend between the front and rear wall. The sidewalls may be flat or may be curved. The front wall and portions of sidewalls may be formed from a glass layer or other transparent member. A touch sensor layer and display layer may extend under the front and sidewall portions of the glass layer. A touch sensor layer may also extend under the opposing rear wall.

A foldable electronic device may have a flexible transparent wall portion that joins planar transparent walls. Components may be interposed between the transparent planar walls and opaque walls. Display and touch layers may be overlapped by the transparent walls and the transparent flexible wall portion. Additional touch layers may be overlapped by the opaque walls.

DETAILED DESCRIPTION

An electronic device may be provided with input-output devices to gather input and to provide output to a user. The input-output devices may include touch sensor structures. The electronic device may have control circuits, batteries, and other components that are enclosed within the walls of an enclosure. The walls may have opaque portions and transparent portions. The opaque portions may include opaque plastic, metal, fiber-composite materials and layers of other materials with fibers, ceramic, and other opaque materials and may include transparent material that is coated with one or more opaque layers (e.g., clear glass, clear plastic, sapphire, or other transparent material coated on an inner surface with an opaque masking layer). The transparent wall portions may be formed from clear glass, clear plastic, sapphire, or other transparent materials.

Display structures may be mounted behind the transparent portions and may display images for a user. The images may include video, graphics, text, virtual buttons, and other visual content. The touch sensor structures may be mounted behind the transparent portions and behind the opaque portions. The touch sensor structures may have portions that overlap the display structures, thereby forming a touch screen display region on the device. The touch sensor structures may also have portions that do not overlap the display structures and which therefore serve exclusively as touch sensor inputs.

Touch sensor structures and display structures may be formed from thin layers of material and may therefore sometimes be referred to touch sensor layers and display layers. The touch sensor and display layers may be formed on rigid substrates such as glass layers and rigid printed circuit board layers and/or may be formed on flexible substrates (e.g., flexible printed circuit material such as flexible layers of polyimide or sheets of other flexible polymer material). In some configurations, touch sensor structures and display structures may be formed as coating layers on the surface of an enclosure wall. Combinations of these approaches may also be used, if desired.

Figure 1:
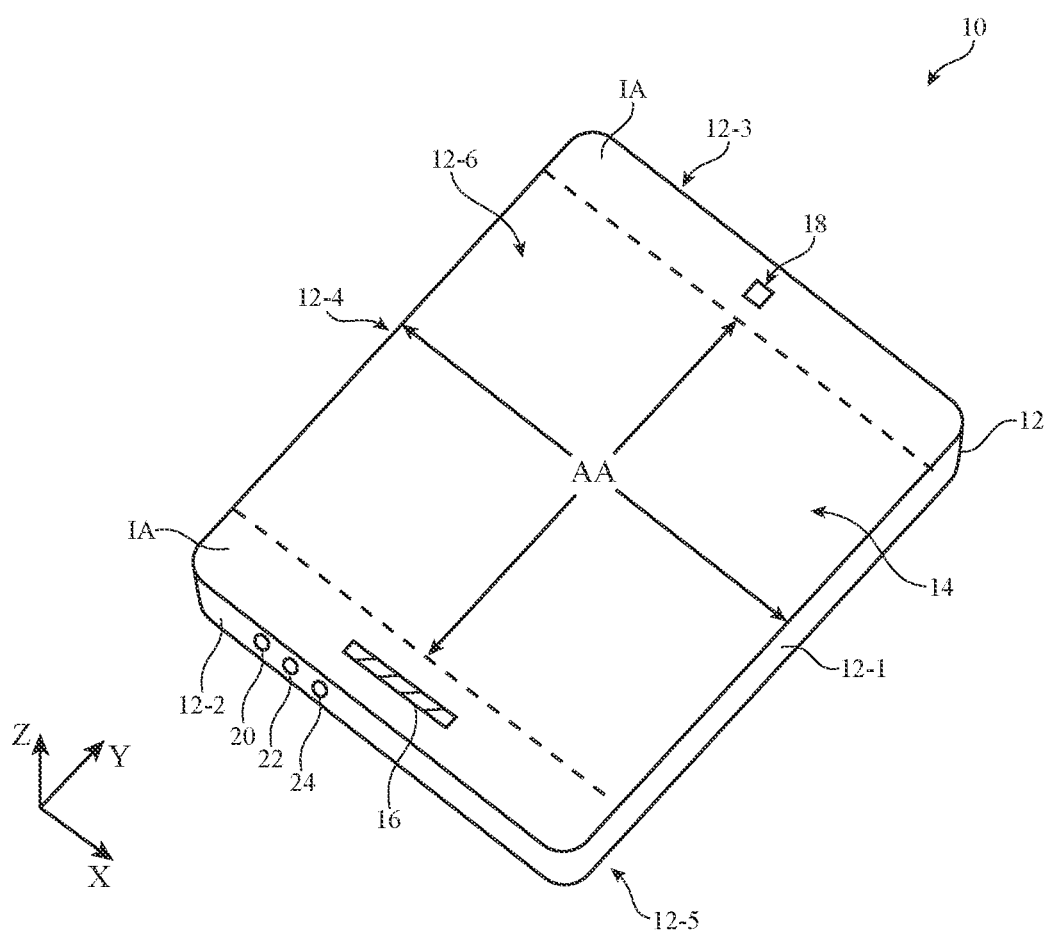
FIG. 1 is a perspective view of an illustrative electronic device in accordance with an embodiment.

A perspective view of an illustrative electronic device of the type that may be provided with touch sensor structures and display structures is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device (e.g., a watch with a wrist strap), a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wrist device, or other portable computing device. Other configurations may be used for device 10 if desired. The example of FIG. 1 is merely illustrative.

In the example of FIG. 1, device 10 includes a display such as display 14. The components of device 10 may be mounted within enclosure walls 12. Some of enclosure walls 12 such as illustrative front face wall 12-6 may be formed from clear glass, clear plastic (e.g., rigid and/or flexible plastic with a clear hard coating such as an inorganic antiscratch layer formed from silicon nitride, metal nitride, titanium nitride, silicon oxide, metal oxide, diamond-like coating material, or other material with abrasion resistance), sapphire, or other transparent material and can therefore serve as covers for display layers. In this context the walls may sometimes be referred to as display cover layers (i.e., wall 12-6 may cover a display layer that displays images and that serves as display 14). Other portions of enclosure walls 12 may be formed from opaque plastic (e.g., flexible and/or rigid plastic covered with a hard coating layer), metal, or clear material coated with opaque masking material (e.g., an inner layer of black ink). Opaque wall portions of the enclosure for device 10 may sometimes be referred to as housing structures.

The display layers of device 10 need not be confined to front wall 12-6 of device 10. In the illustrative configuration of FIG. 1, device 10 has six sides: right sidewall 12-1, left sidewall 12-2, top sidewall 12-3, bottom sidewall 12-2, rear wall 12-5, and front wall 12-6. Display layers and touch sensor layers in device 10 can cover some or all of these surfaces. As one example, touch sensor layers may cover all surfaces of device 10 and the display structures of device 10 may be confined to central ("active area") portion AA of front wall 12-6. As another example, the display for device 10 may cover portion AA on front wall 12-6 and the touch sensors for device 10 may cover front wall 12-6 including portion AA and may cover opaque ("inactive area") portions IA at the upper and lower ends of front face 12-6. Yet another example involves wrapping a display around some or all of device 10 (e.g., to cover a strip in the center of device 10 including active area AA, corresponding portions of sidewalls 12-1 and 12-2, and some or all of the center of rear face 12-5). In this type of arrangement, touch sensors may be formed in at least the areas covered with the display structures and may optionally cover other portions of device 10 (e.g., ends 12-2 and 12-1, inactive areas IA on front face 12-6, etc.).

Openings may be formed in the walls of enclosure 12. For example, openings such as opening 16 may be formed to accommodate a button, openings such as opening 18 may be formed to accommodate a speaker port, openings such as opening 22 in bottom sidewall 12-2 may be formed to accommodate a connector port, and adjacent openings such as openings 20 and 24 may be used to form speaker and microphone ports, respectively (as examples).

Figure 2:
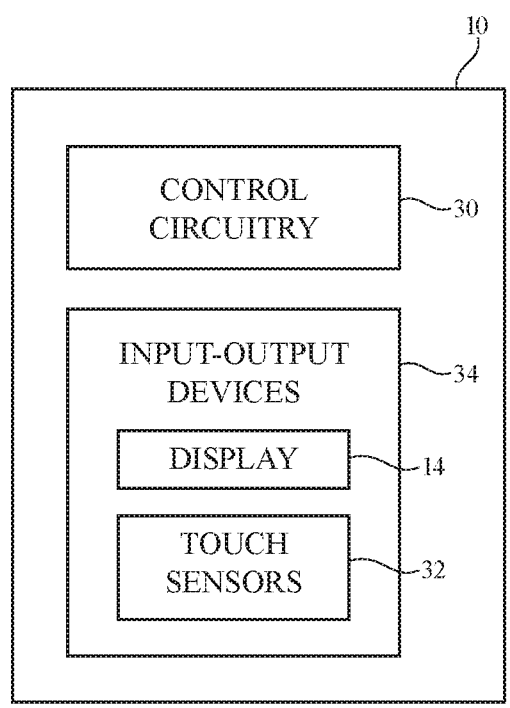
FIG. 2 is a schematic diagram of an illustrative electronic device in accordance with an embodiment.

FIG. 2 is a schematic diagram of device 10. As shown in FIG. 2, electronic device 10 may have control circuitry 30. Control circuitry 30 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 30 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 34 may be used to allow data to be supplied to device 10 and to allow data to be provided from device 10 to external devices. Input-output devices 34 may include buttons, joysticks, scrolling wheels, touch pads, key pads, keyboards, microphones, speakers, tone generators, vibrators, cameras, sensors (e.g., ambient light sensors, proximity sensors, magnetic sensors, force sensors, touch sensors such as touch sensors 32, accelerometers, and other sensors), light-emitting diodes and other status indicators, data ports, displays such as display 14, etc. A user can control the operation of device 10 by supplying commands through input-output devices 34 and may receive status information and other output from device 10 using the output resources of input-output devices 34.

Touch sensors 32 may be formed using any suitable touch technology. As an example, touch sensors 32 may be formed from one or more patterned layers of capacitive touch sensor electrodes. Other types of touch sensor may be used in device 10 if desired (e.g., touch sensors having touch sensor components such as resistive touch sensor components, acoustic touch sensor components, force-based touch sensor components, light-based touch sensor components, etc.). Touch sensor structures may be transparent and/or may be opaque. For example, touch sensors that are transparent may have transparent touch sensor structures such as capacitive touch screen electrodes that are formed from an array of indium tin oxide electrodes or other transparent conductive electrode structures. If desired, transparent touch sensor structures may have thin metal lines (e.g., nanostructures) that are sufficiently small to be invisible to the eye. Opaque capacitive touch sensors may be formed from opaque capacitive touch sensor electrodes such as metal capacitive touch sensor electrodes.

Each display layer for the display(s) 14 in device 10 may include an array of pixels formed from liquid crystal display (LCD) components, an array of electrophoretic pixels, an array of plasma pixels, an array of organic light-emitting diode pixels, an array of discrete light-emitting diodes, an array of electrowetting pixels, or pixels based on other display technologies.

Control circuitry 30 may be used to run software on device 10 such as operating system code and applications. During operation of device 10, the software running on control circuitry 30 may use touch sensors 32 in devices 34 to gather touch sensor input from a user. A user may, for example, supply touch input using one or more fingers and/or other external objects (e.g., a stylus, etc.). The touch input may be supplied to any of the surfaces of device 10 that include touch sensor structures 32 (e.g., walls 12-1, 12-2, 12-3, 12-4, 12-5, and/or 12-6.). Touch input may include multi-touch gestures and other gestures (e.g., swipes, finger pinches, taps, etc.). In gaming applications and other applications, it may be desirable to use a touch sensor on the rear surface of device 10 to gather touch input while displaying associated visual information on a display on the opposing front surface of device 10. Configurations in which a user supplies touch input to the upper and lower ends of device 10 (e.g., in inactive areas IA) while holding device 10 in a landscape configuration to view images in active area AA of FIG. 1 may also be used. Touch input on sidewalls in device 10 may be used as a control for a camera (e.g., a virtual shutter button input), may be used as input in other virtual button scenarios, may be used in implementing a volume slider button or a slider button for controlling other device operations (e.g., screen brightness, color settings, contrast settings, etc.).

Figure 3:
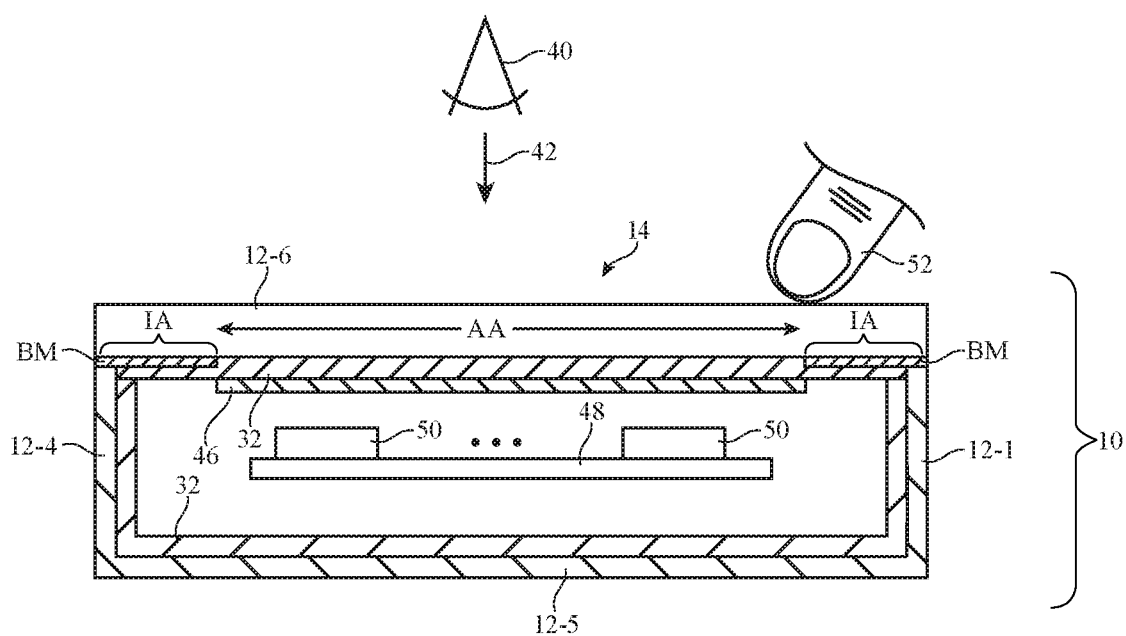
FIG. 3 is a cross-sectional side view of an electronic device in accordance with an embodiment.

A cross-sectional side view of an illustrative device with touch sensor and display structures is shown in FIG. 3. As shown in FIG. 3, device 10 may have walls such as opposing front wall 12-6 and rear wall 12-5 and walls such as left sidewall 12-4 and right sidewall 12-1. Batteries, integrated circuits, and other electrical components 50 (see, e.g., control circuitry 30 and input-output devices 34) may be enclosed within the device enclosure formed from walls 12. As shown in FIG. 3, components 50 may be mounted on one or more substrates such as substrate 48. Substrates such as substrate 48 may include printed circuits (e.g., rigid printed circuit boards formed from rigid printed circuit board material such as fiberglass-filled epoxy and flexible printed circuits formed from flexible layers of polymer such as polyimide or other flexible sheets of polymer), molded plastic, glass, ceramic, and other dielectric substrate materials.

Portions of walls 12 of device 10 may be transparent. In the illustrative configuration of FIG. 3, for example, front wall 12-6 has been formed from a transparent material such as glass (i.e., wall 12-6 in the FIG. 3 example may form a planar display cover layer). Display layer 46 (e.g., a liquid crystal display layer, an organic light-emitting diode display layer, or any other display layer for display 14) may form images (i.e., display layer 46 may contain an array of pixels to form display 14). Edge portions IA may have an inner surface coated with black masking layer BM, thereby rendering these portions of wall 12-6 opaque. Touch sensor circuitry 32 may be formed in active area AA and in inactive areas IA. This allows a user to supply touch input in areas IA (e.g., using the user's thumbs, other fingers such as finger 52 of FIG. 3, and/or other external objects) without blocking display layer 46. Other portions of the enclosure of device 10 may be opaque. For example, the sidewalls of device 10 such as walls 12-4 and 12-1 and upper and lower walls 12-2 and 12-3 (FIG. 1) may be formed form opaque material and rear wall 12-5 may be formed form opaque material. As shown in FIG. 3, touch sensor layer 32 may be formed on the inner surfaces of some or all of these opaque walls to provide the exterior surfaces of these portions of device 10 with touch input capabilities.

Figure 4:
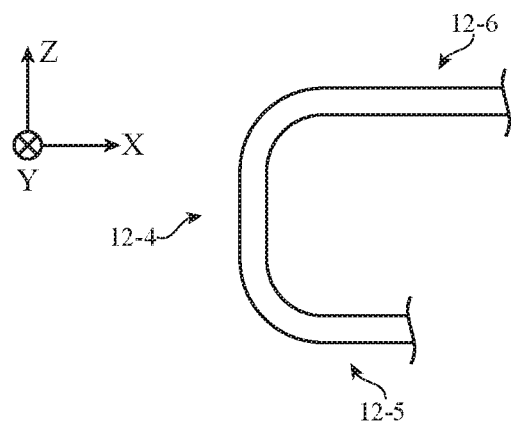
FIG. 4 is a cross-sectional side view of an illustrative electronic device having a vertical sidewall portion in accordance with an embodiment.
Figure 5:
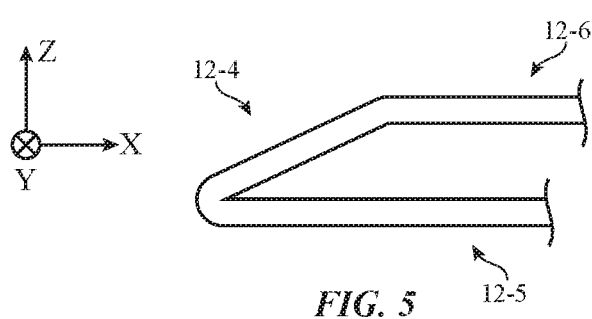
FIG. 5 is a cross-sectional side view of an illustrative electronic device with a sidewall portion that slopes away from a front device surface in accordance with an embodiment.
Figure 6:
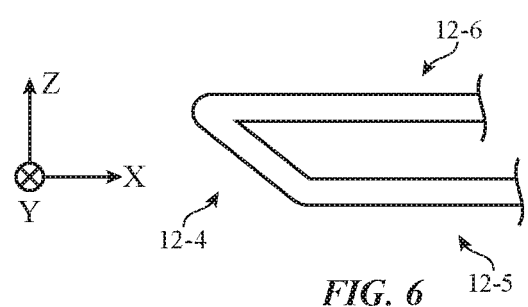
FIG. 6 is a cross-sectional side view of an illustrative electronic device with a sidewall portion that slopes away from a rear device surface in accordance with an embodiment.
Figure 7:
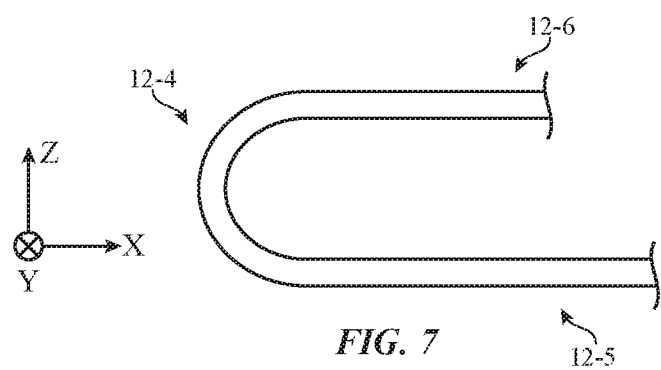
FIG. 7 is a cross-sectional side view of an illustrative electronic device with a curved sidewall in accordance with an embodiment.

In the illustrative example of FIG. 3, the enclosure sidewalls for device 10 are flat and are oriented vertically. Cross-sectional side views of an edge portion of device 10 in scenarios in which device 10 has different illustrative sidewall profiles are shown in FIGS. 4, 5, 6, and 7. In FIG. 4, sidewall 12-4 has a vertical shape and runs perpendicular to the planes of upper wall 12-6 and rear wall 12-5. Upper wall 12-6 and rear wall 12-5 may be planar or may have convex and/or concave shapes. The example of FIG. 5 shows how sidewall 12-4 may slope away from front wall 12-6. The example of FIG. 6 show how sidewall 12-4 may slope away from rear wall 12-5. Another illustrative configuration is shown in FIG. 7. With the arrangement of FIG. 7, sidewall 12-4 has a curved shape. The profile of a curved wall in device 10 may be semicircular, may have one or more flat sections joined by one or more curved portions, may have a half-oval shape, or may have any other curved and/or straight wall profile. The arrangement of FIG. 7 is shown as an example. Sidewall profiles of the types shown in FIGS. 4, 5, 6, and 7, may be used on one, two, or three or more peripheral edges of device 10.

Figure 8:
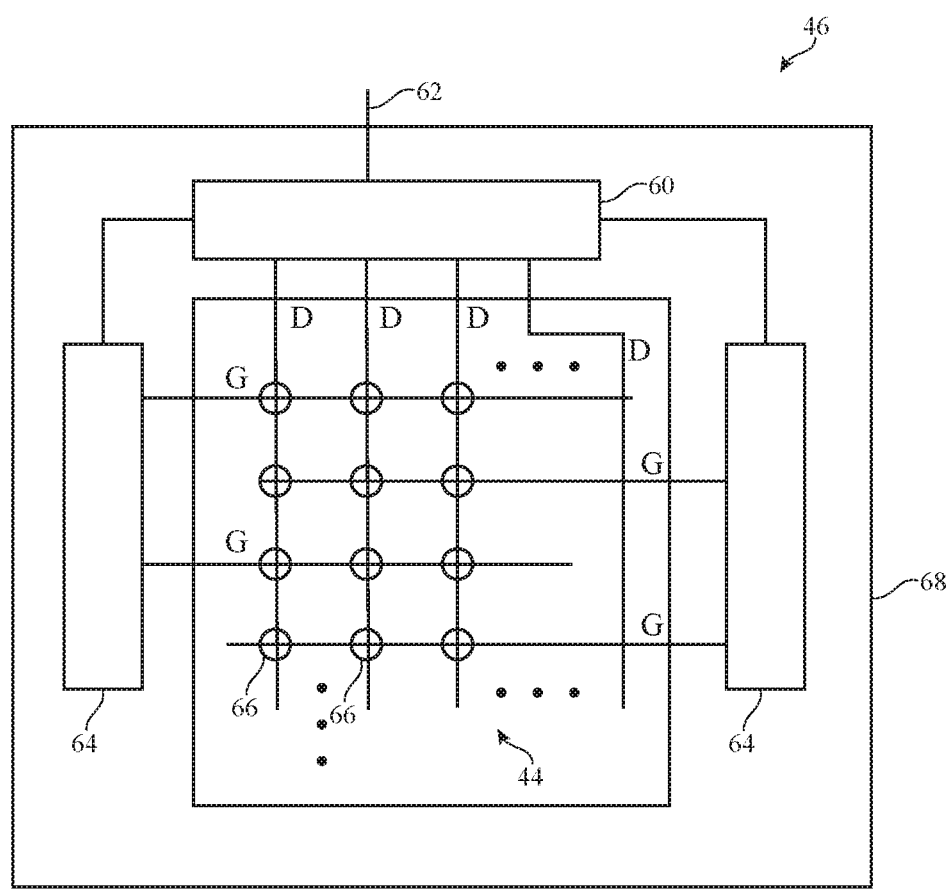
FIG. 8 is a top view of an illustrative display in accordance with an embodiment.

An illustrative display layer for displays in device 10 such as display 14 is shown in FIG. 8. As shown in FIG. 8, display layer 46 may include an array of pixels 66 such as pixel array 44. Pixel array 44 may be controlled using control signals produced by display driver circuitry. Display driver circuitry may be implemented using one or more integrated circuits (ICs) and/or thin-film transistors or other circuitry. The display driver circuitry may include, for example, display driver circuitry 60 that receives image data from control circuitry 30 via path 62 and gate driver circuitry 64. The display driver circuitry may convert the image data into signals for controlling pixels 66 of pixel array 44.

Pixel array 44 may contain rows and columns of pixels 66. The circuitry of pixel array 44 (i.e., the rows and columns of pixel circuits for pixels 66) may be controlled using signals such as data line signals on data lines D and gate line signals on gate lines G. Data lines D and gate lines G are orthogonal. For example, data lines D may extend vertically and gate lines G may extend horizontally (i.e., perpendicular to data lines D).

Pixels 66 in pixel array 44 may contain thin-film transistor circuitry (e.g., polysilicon transistor circuitry, amorphous silicon transistor circuitry, semiconducting-oxide transistor circuitry such as indium gallium zinc oxide transistor circuitry, other silicon or semiconducting-oxide transistor circuitry, etc.) and associated structures for producing electric fields across a liquid crystal layer (in a liquid crystal display), for applying control signals to light-emitting diodes (in an organic light-emitting diode display or other display with pixels formed from light-emitting diodes), or for producing other pixel control signals (e.g., control signals for pixels in other types of displays). The thin-film transistor structures that are used in forming pixels 66 may be located on a thin-film transistor substrate such as a flexible polymer layer, a layer of glass, or other substrate(s) 68.

Gate driver circuitry 64 may be used to generate gate signals on gate lines G. The gate driver circuitry may be formed from thin-film transistors on the thin-film transistor layer or may be implemented in separate integrated circuits. The data line signals on data lines D in pixel array 44 carry analog image data (e.g., voltages with magnitudes representing pixel brightness levels). During the process of displaying images on display layer 46, a display driver integrated circuit or other circuitry 60 may receive digital data from control circuitry 30 via path 62 and may produce corresponding analog data signals. The analog data signals may be demultiplexed and provided to data lines D. If desired, other types of control schemes may be used for pixels 66 in array 44 of display layer 46. The arrangement of FIG. 8 is merely illustrative.

Figure 9:
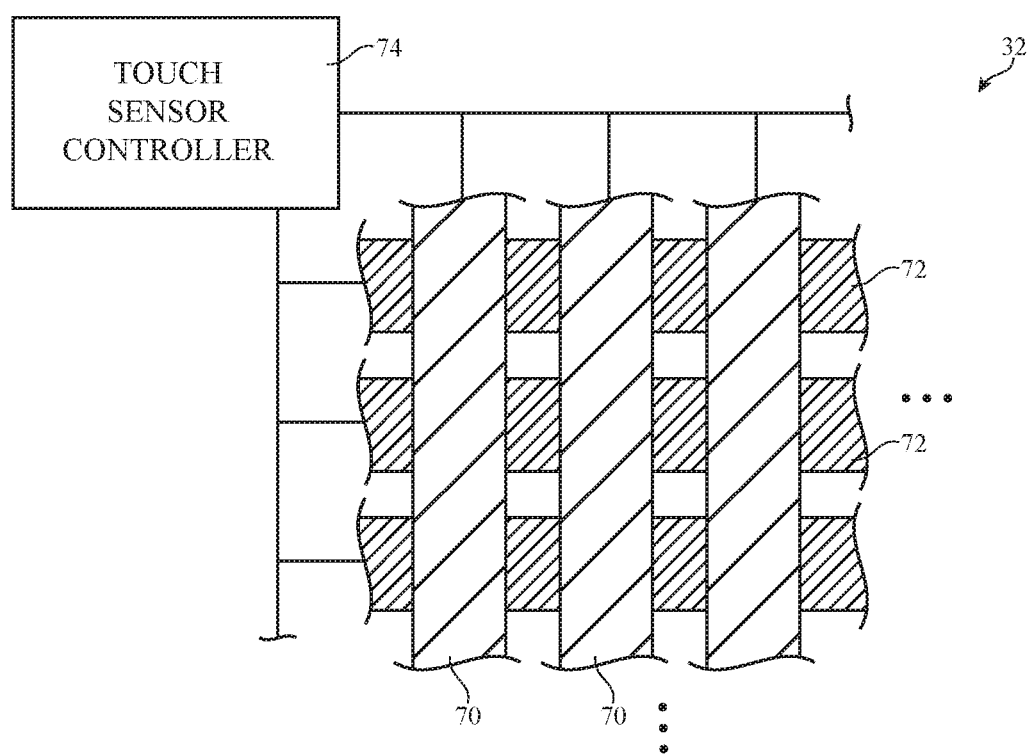
FIG. 9 is a top view of an illustrative touch sensor in accordance with an embodiment.

FIG. 9 is a diagram of an illustrative touch sensor for device 10. Touch sensor layers for device 10 may be formed using any suitable touch technology. With the example of FIG. 9, touch sensor layer 32 is a capacitive touch sensor layer having capacitive touch sensor electrodes 70 and 72. Touch sensor controller 74 may supply drive signals to the touch sensor electrodes while gathering corresponding sense signals from the electrodes, thereby determining the location of a user's touch within the electrodes. Electrodes 70 and 72 may be formed from a transparent conductive material such as indium tin oxide or invisibly thin conductive lines (e.g., in configurations in which it is desired for layer 32 to be transparent) or from opaque materials such as metal (e.g., in configurations in which layer 32 need not be transparent). Electrodes 70 and 72 may be formed on opposing sides of a flexible printed circuit, may be formed as multiple layers in a touch sensor coating formed on walls 12 or other portions of device 10, may be formed using single-sided electrode patterns, may be formed using double-sided electrode patterns, may be formed on the same substrate as pixels 66 (e.g., in an arrangement in which some of the display structures and some of the touch sensor structures are shared and form a unitary touch and display layer), may be formed using patterns of squares, diamonds, or other capacitive electrode shapes, or may be formed using any other suitable touch sensor configuration. The configuration of FIG. 9 in which sets of perpendicular touch sensor capacitive electrode strips are arranged in a grid is merely illustrative.

FIGS. 10, 11, 12, and 13 are cross-sectional side views of a portion of enclosure wall 12 for device 10 that have been covered with display layers and/or touch sensor layers using different illustrative configurations.

Figure 10:
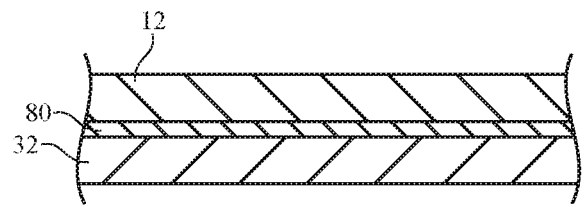
FIG. 10 is a cross-sectional side view of a portion of an electronic device with a wall such as an opaque wall and a touch sensor that is attached to an inner surface of the wall in accordance with an embodiment.

In the arrangement of FIG. 10, wall 12 is opaque and touch sensor layer 32 has been attached to wall 12 using adhesive layer 80. Layer 32 may be, for example, a flexible touch sensor panel formed on a flexible printed circuit substrate using metal capacitive touch sensor electrodes (e.g., wires, metal strips, metal pads, etc.).

Figure 11:
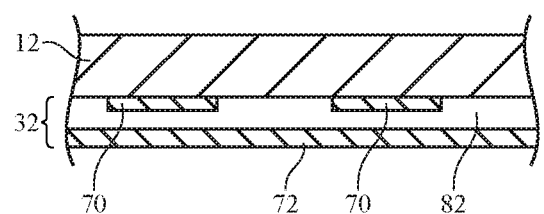
FIG. 11 is a cross-sectional side view of a portion of an electronic device with an opaque wall having an inner surface on which a touch sensor has been formed as a coating in accordance with an embodiment.

In the arrangement of FIG. 11, wall 12 is opaque. Touch sensor layer 32 has been fabricated as a coating on the inner surface of wall 12 by depositing and patterning touch sensor structures. As an example, electrodes 70 may be deposited as a coating layer on the inner surface of wall 12 and patterned using photolithography, laser etching, etc. Shadow mask patterning may also be used, if desired. Dielectric layer 82 (e.g., a polymer or an inorganic dielectric layer) may then be deposited over electrodes 70. Electrodes 72 may be deposited and patterned on dielectric layer 82 to form touch sensor layer 32.

Figure 12:
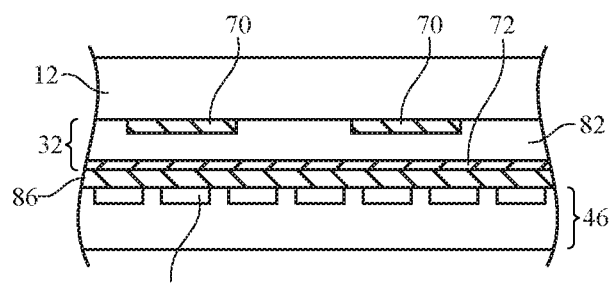
FIG. 12 is a cross-sectional side view of a portion of an electronic device with a clear wall having an inner surface on which a touch sensor has been formed as a coating and to which a display layer has been attached using adhesive in accordance with an embodiment.

In portions of device 10 in which display output is desired, wall 12 may be transparent. An illustrative portion of wall 12 that is transparent is shown in FIG. 12. In the arrangement of FIG. 12, touch sensor layer 32 has been formed as a coating on the inner surface of transparent wall 12 (e.g., by depositing electrodes 70, dielectric coating 82, and electrodes 72). Display layer 46 (e.g., a display formed form a rigid substrate or a flexible polymer substrate) may be attached to the inner surface of transparent wall 12 over touch sensor layer 32 using a layer of clear adhesive such as adhesive 86. If desired, a display layer may be deposited and patterned as a coating on touch sensor layer 32 and/or display layer structures and touch sensor structures may be formed as a unitary layer and deposited on wall 12 as a coating or attached to wall 12 with adhesive.

Figure 13:
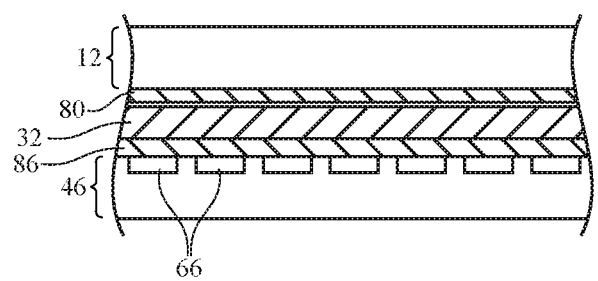
FIG. 13 is a cross-sectional side view of a portion of an electronic device with a clear wall having an inner surface to which a touch sensor layer and display have been attached in accordance with an embodiment.

If desired, both the touch sensor layer and the display layer may be provided on flexible substrates or other suitable substrates that are attached to the inside of a transparent portion of wall 12 using adhesive layers. This type of arrangement is shown in FIG. 13. As shown in FIG. 13, adhesive layer 80 may be used to attach touch sensor layer 32 (e.g., a flexible printed circuit touch sensor formed from capacitive touch sensor electrodes on a flexible polymer substrate) to transparent wall 12 and adhesive layer 86 may be used to attach display layer 46 (e.g., a flexible display such as an organic light-emitting diode display, an electrophoretic display, or other suitable display with an array of pixels 66) to touch sensor layer 32. Adhesive layers 80 and 86 may be transparent to allow pixels 66 to produce images that are visible from outside of device 10 through transparent wall 12.

The configurations for incorporating touch and display layers into device 10 under opaque and transparent portions of wall 12 that are described in connection with FIGS. 10, 11, 12, and 13 are merely illustrative. Other types of display and touch layer configuration may be used, if desired (e.g., arrangements in which a single substrate is used to support both touch and display circuitry, etc.). Moreover, in some situations display layer 46 may overlap only a portion of touch sensor layer 32 (e.g., layer 32 may have portions that extend out from under display layer 46 and are therefore uncovered by display layer 46). Display layer 46 may also have potions that do not overlap any portion of touch sensor layer 32.

Figure 14:
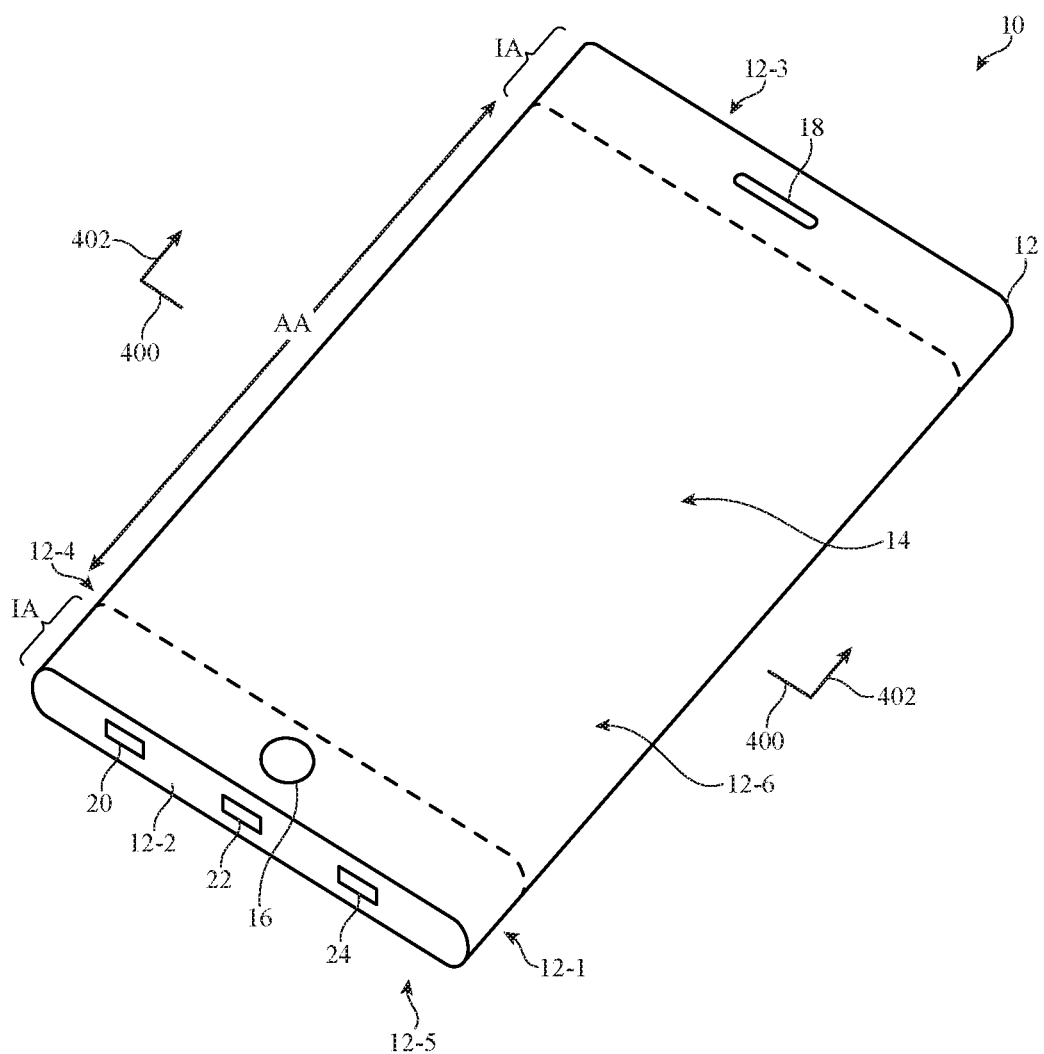
FIG. 14 is a perspective view of an illustrative electronic device of the type that may be provided with display and touch sensor structures in accordance with an embodiment.

In configurations for device 10 in which some of the walls of device 10 are curved, flexible touch and/or display layers may be provided with corresponding curved shapes (e.g., by bending flexible display and/or touch sensor layers, etc.). Consider, as an example, the arrangement of device 10 that is shown in FIG. 14. As shown in the example of FIG. 14, device 10 may have six enclosure walls: opposing left and right sidewalls 12-4 and 12-1, opposing top and bottom sidewalls 12-3 and 12-2, and opposing front and rear sidewalls 12-6 and 12-5. Inactive areas IA may extend as strips around some or all of the top and bottom ends of enclosure 12. Display 14 may be formed in an active area AA that extends over at least the center portion of front wall 12-6. Display layer(s) 46 for display 14 may optionally cover some or all of walls 12-4 and 12-6 and/or may cover some or all of rear wall 12-5. Touch sensor layer(s) 32 may cover front wall 12-6 in active area AA and optionally in inactive areas IA, may cover some or all of sidewalls 12-4 and 12-6, may cover some or all of rear wall 12-5, and may cover some or all of upper and lower sidewalls 12-2 and 12-3. If desired, display layers 46 may also cover portions of device 10 such as upper and lower sidewalls 12-2, 12-3, rear wall 12-5, etc.

Figure 15:
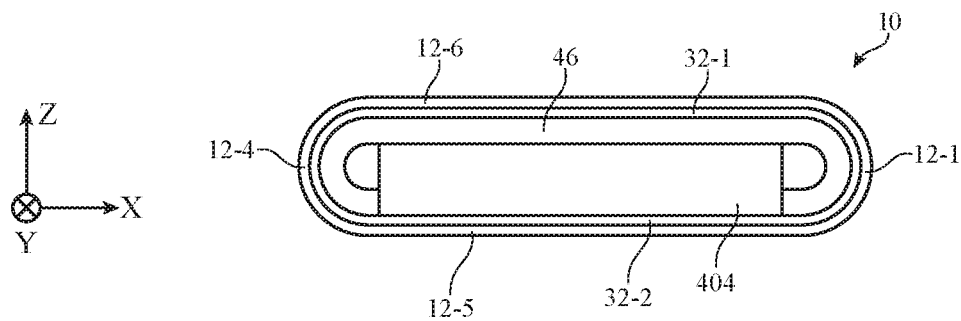
FIGS. 15, 16, and 17 are cross-sectional side views of illustrative electronic devices with touch sensor and display structures in accordance with an embodiment.
Figure 16:
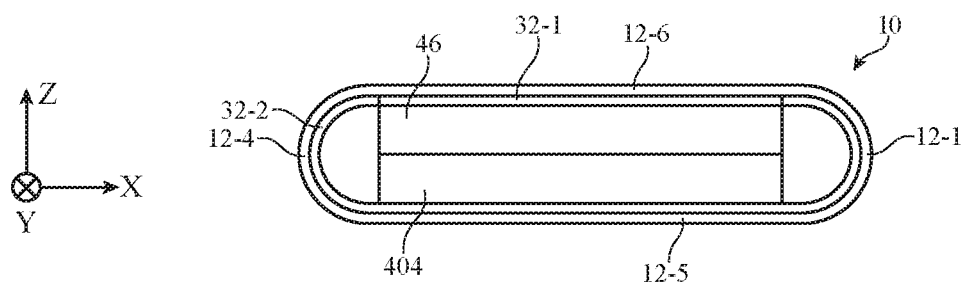
Figure 17:
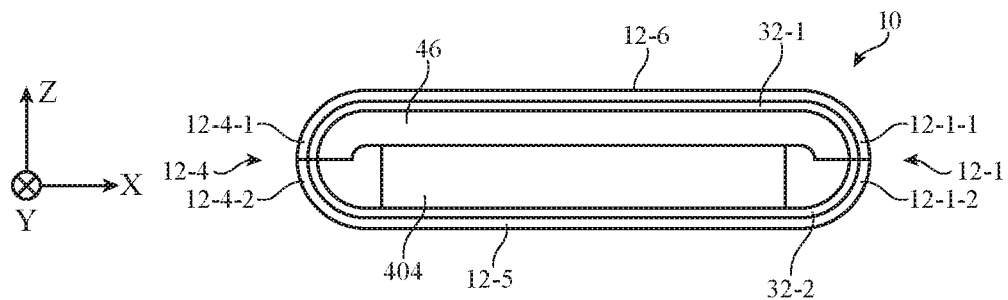

In the illustrative configuration of FIG. 14, display and/or touch layers may have curved shapes that match the curved profiles of curved sidewalls 12-4 and 12-1. FIGS. 15, 16, and 17 are cross-sectional side views of a device such as device 10 of FIG. 14 taken along line 400 and viewed in direction 402.

Illustrative device 10 of FIG. 15 has a downward facing planar touch sensor such as touch sensor layer 32-2 and has an upwards facing touch sensor layer with curved sidewall portions such as touch sensor layer 32-1. Front wall 12-6 and sidewalls 12-4 and 12-1 may be transparent and may, if desired, be formed from an integral member (e.g., a unitary glass layer, etc.) with a planar center portion (forming wall 12-6) and curved edge portions (forming curved sidewalls 12-4 and 12-1). Display layer 46 may have a planar portion that extends under transparent front planar wall 12-6 and integral curved edge portions that extend under transparent curved sidewalls 12-4 and 12-1. Touch sensor layer 32-1 is transparent to allow images from display layer 46 to be viewed through walls 12-1, 12-4, and 12-6. Touch sensor 32-2 may be overlapped by rear wall 12-5 and may gather touch input through rear wall 12-5. Rear wall 12-5 may be opaque and touch sensor 32-2 may be transparent or opaque. Electrical components 404 may be housed in the interior cavity of device 10 that is enclosed by the enclosure walls.

Illustrative device 10 of FIG. 16 has an upwards facing planar touch sensor such as touch sensor layer 32-1 and has a downwards facing touch sensor layer with curved sidewall portions such as touch sensor layer 32-2. Rear wall 12-5 and sidewalls 12-4 and 12-1 may be opaque and may, if desired, be formed from an integral member with a planar center portion (forming wall 12-5) and curved edge portions (forming curved sidewalls 12-4 and 12-1). Touch sensor layer 32-2 may be transparent or opaque. Display layer 46 and touch sensor layer 32-1 lie under planar front wall 12-6. Front wall 12-6 and touch sensor layer 32-1 may be transparent to allow display 46 to produce visible images. Electrical components 404 may be housed in the interior cavity of device 10 that is enclosed by the enclosure walls.

Illustrative device 10 of FIG. 17 has an upper wall portion formed from upper left sidewall portion 12-4-1, front wall 12-6, and upper right sidewall portion 12-1-1. The upper wall portion may be transparent and may overlap transparent touch sensor layer 32-1 and display layer 46, each of which may have curved edges that conform to the curved edge shape of the upper wall portion. Device 10 may also have a lower wall portion formed from lower left sidewall portion 12-4-2, rear wall 12-5, and lower right sidewall portion 12-1-2. The lower wall portion may be opaque and may overlap a transparent or opaque touch sensor layer such as touch sensor layer 32-1. Electrical components 404 may be housed in the interior cavity of device 10 that is enclosed by the enclosure walls.

Figure 18:
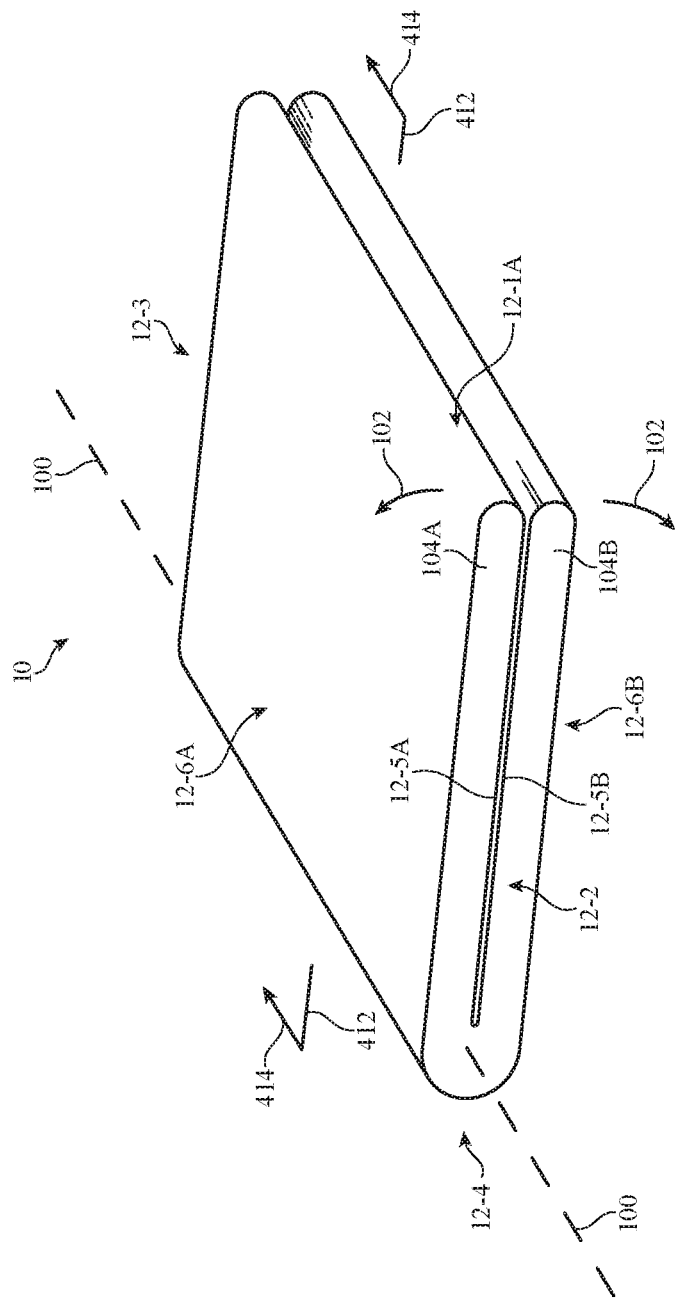
FIG. 18 is a perspective view of an illustrative folding electronic device of the type that may be provided with display and touch sensor structures in accordance with an embodiment.

If desired, device 10 may have an enclosure that allows device 10 to be folded one or more times along one or more fold axes. In the example of FIG. 18, the enclosure of device 10 is flexible along fold axis (bend axis) 100. This allows device 10 to be folded and unfolded like a book. As shown in FIG. 18, end 104A of a first half of device 10 is located adjacent to sidewall 12-1A (e.g., a curved sidewall) and end 104B of a second half of device 10 is located adjacent to sidewall 12-1B (e.g., a curved sidewall). Opposing curved sidewall 12-4 runs parallel to fold axis 100 and may be formed from a flexible material. In the folded (closed) configuration of FIG. 18, ends 104A and 104B are adjacent to each other. When it is desired to open device 10, ends 104A and 104B may be moved away from each other in directions 102, causing device 10 and flexible wall portion 12-4 to flex along bend axis 100.

Display layer 46 for device 10 may be located on rear wall portions 12-5A and 12-5B and/or may be located on front wall portions 12-6A and 12-6B. Touch sensor layer 32 may likewise be located on rear wall portions 12-5A and 12-5B and/or may be located on front wall portions 12-6A and 12-6B.

Figure 19:
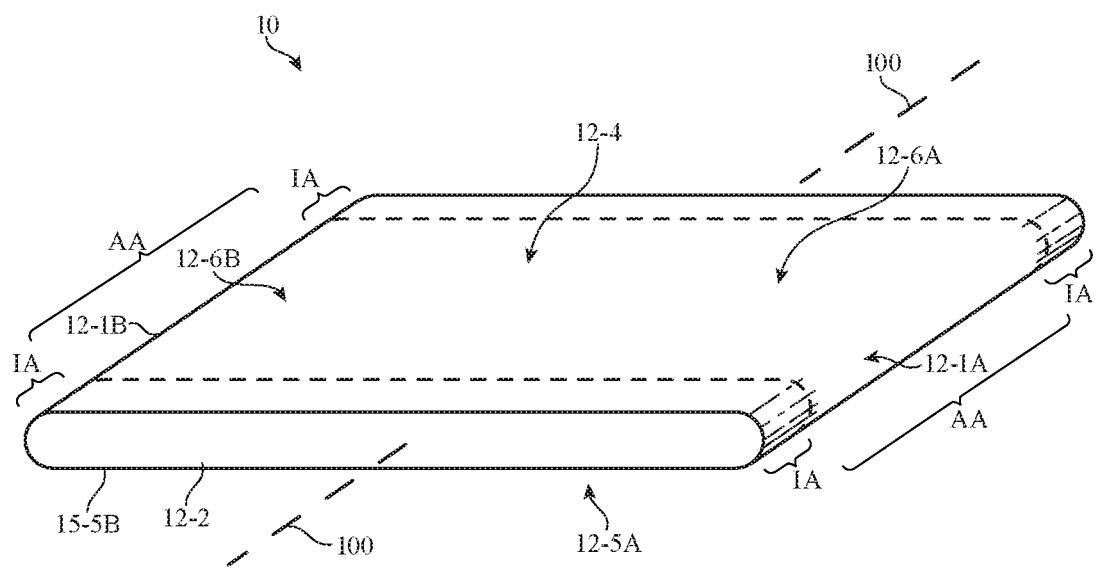
FIG. 19 is a perspective view of the electronic device of FIG. 18 in an unfolded configuration in accordance with an embodiment.

Portions of touch sensor layer 32 and/or display layer 46 may cover some or all of the sidewalls of device 10. For example, a continuous display may be formed from display layers on walls 12-6A and 12-6B by ensuring that display layer 46 lies under curved wall 12-4 (which lies between walls 12-6A and 12-6B when device 10 is in its unfolded state). When a device of this configuration is opened, walls portions 12-6A, 12-4, and 12-6B form a unitary display for device 10, as shown in FIG. 19. Sidewall portions 12-1A and 12-1B and, if desired, some or all of wall portions 12-5B and 12-5A may optionally also be covered with display layer 46 and/or touch layer 32. Display layer 46 may extend along all of device 10 parallel to bend axis 100 or may be restricted to a central strip (shown as area AA) that lies between respective strips of inactive areas IA on the upper and lower edges of device 10. Touch sensor layer 32 may extend under area AA and may, if desired, extend under some or all of areas 1A.

Figure 20:
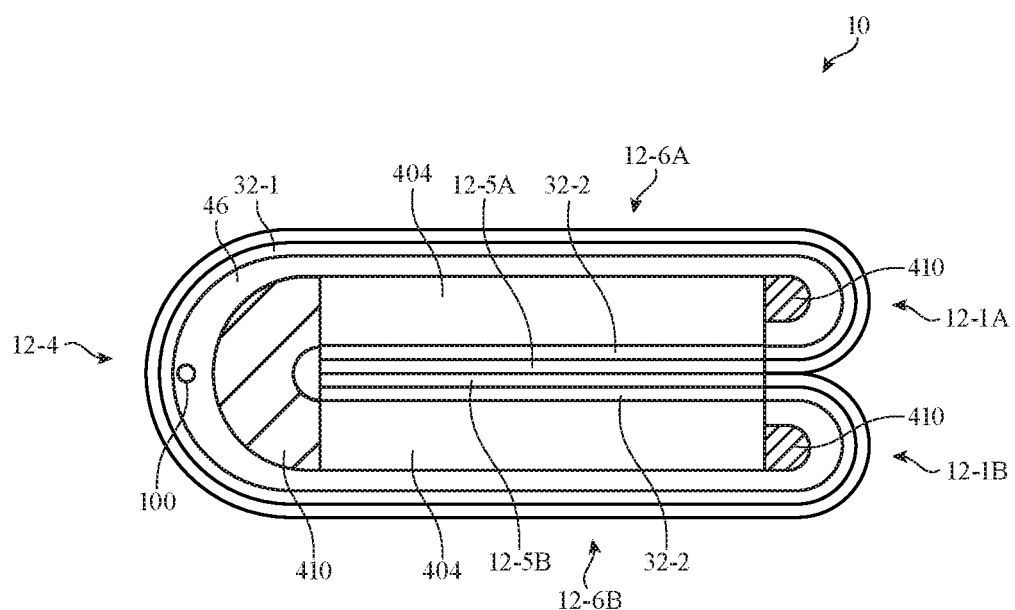
FIG. 20 is a cross-sectional side view of an illustrative device of the type shown in FIGS. 18 and 19 in a folded configuration in accordance with an embodiment.

A cross-sectional side view of device 10 of FIG. 18 taken along line 412 of FIG. 18 and viewed in direction 414 in an illustrative configuration in which touch sensor layers are provided on surfaces 12-5A, 12-5B, 12-6A, 12-6B, 12-4, 12-1A, and 12-1B is shown in FIG. 20. Support structures 410 may be formed form an elastomeric material and/or other bendable materials to allow device 10 to be opened and closed by bending the enclosure for device 10 along bend axis 100. Transparent touch sensor layer 32-1 and display layer 46 are overlapped by transparent walls 12-1A, 12-6A, 12-4, 12-6B, and 12-1B. Touch sensor layer 32-2 (e.g., a transparent or opaque touch sensor layer) may be overlapped by walls 12-5A and 12-5B (which may be opaque). Electrical components 404 may be housed in the interior of device 10 that is enclosed by the enclosure walls (i.e., components 404 may be interposed between wall 12-6A and 12-5A and between wall 12-6B and 12-5B. The walls of device 10 of FIG. 20 (e.g., wall portion 12-4 and optionally other walls) may be flexible to accommodate opening and closing of device 10.

Figure 21:
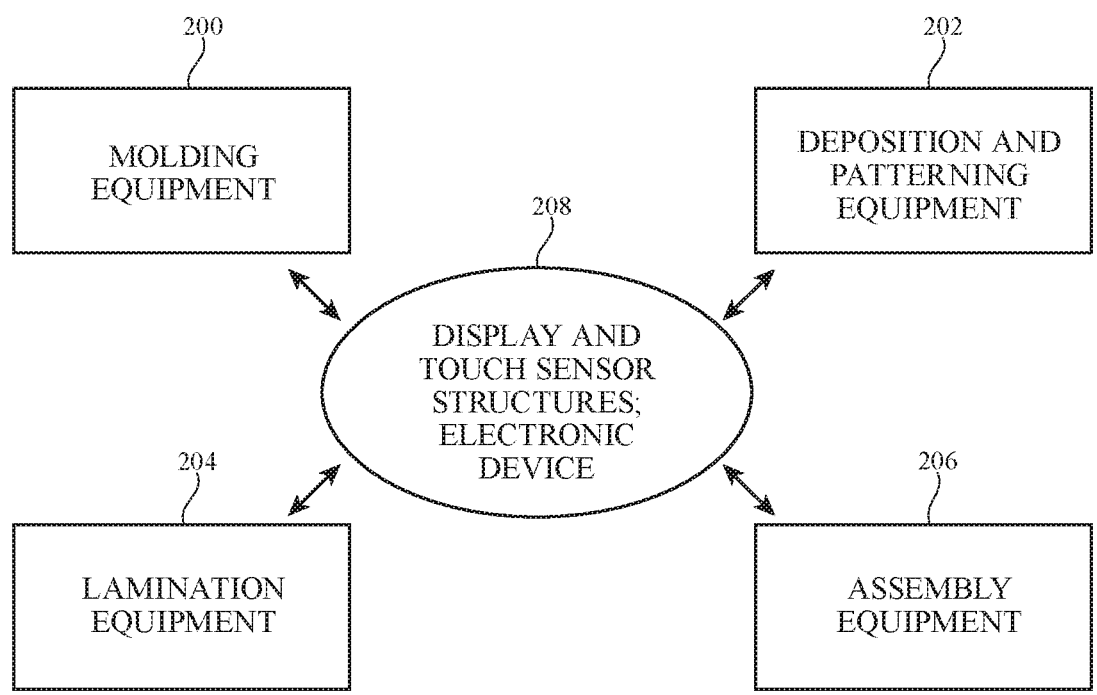
FIG. 21 is a diagram of illustrative equipment that may be used in fabricating electronic devices with touch sensors and display structures in accordance with an embodiment.

Illustrative equipment of the type that may be used in fabricating device 10 is shown in FIG. 21. The equipment of FIG. 21 may be used in processing display layers 46, touch sensor layers 32, walls 12, and other structures for device 10 (shown collectively as structures 208).

Molding equipment 200 may be used to mold transparent glass, transparent sapphire, transparent plastic, or other transparent materials (e.g., under heat and pressure). Equipment 200 may be used to form walls with integral curved edges and other structures 208.

Equipment 202 may include physical vapor deposition equipment, equipment for applying conductive ink, equipment for depositing and patterning semiconductor thin films, equipment for depositing and patterning metal and dielectric layers, printing equipment, equipment for deposing materials by spraying, dipping, screen printing, pad printing, needle dispensing, or other coating techniques, photolithographic patterning equipment, laser and mechanical patterning equipment, and other equipment for depositing and patterning layers of material for structures such as touch sensor layers 32 and display layers 46 (e.g., structures 208). Equipment 202 may be used to apply hard coatings to opaque and/or transparent plastic layers (flexible and/or rigid plastic) or other layers. A hard coating may, for example, form an antiscratch layer. The hard coating may be formed from silicon nitride, metal nitride, titanium nitride, silicon oxide, metal oxide, diamond-like coating material, or other material with abrasion resistance).

Lamination equipment 204 may be used to press layers of material together for structures 208 under heat and pressure and may be used to attach layers of material together using adhesive. Roller-based lamination equipment may be used to attach layers of material to curved walls.

Equipment 206 may be used to assemble structures 208 to form device 10 (e.g., using computer-controlled positioners, machine vision equipment, etc.).

Figure 22:
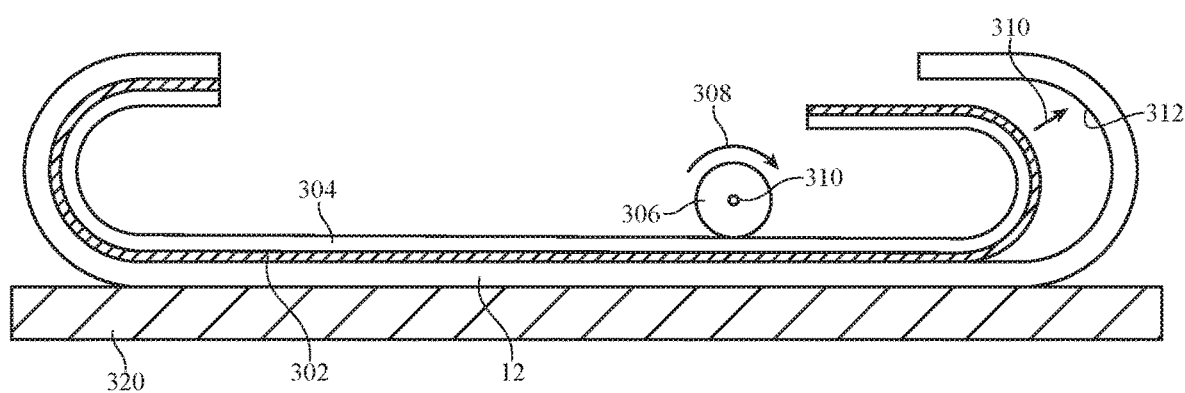
FIG. 22 is a cross-sectional side view of an illustrative electronic device during fabrication operations in which flexible structures for a display and/or touch sensor are being laminated to the planar and curved inner surfaces of an enclosure wall in accordance with an embodiment.

FIG. 22 shows how layers such as illustrative flexible layer 304 (e.g., display layer 46 and/or touch sensor layer 32) may be laminated to the inside of housing wall 12. Roller 306 may be used to press layer 304 against the planar and curved inner surfaces 312 of wall 12 in directions such as direction 310, thereby causing adhesive layer 302 to attach layer 304 to wall 12. Wall 12 may have a planar portion and curved sidewall portions and may be supported by support structure 320 (e.g., a support structure that uses a vacuum to hold wall 12 in place during processing).

Figure 23:
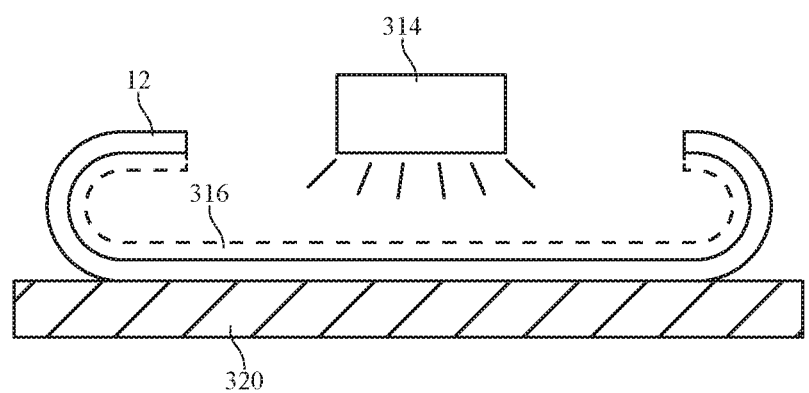
FIGS. 23 and 24 are cross-sectional side views of an illustrative electronic device during fabrication operations in which structures for a display and/or touch sensor are being deposited and patterned on the planar and curved inner surfaces of an enclosure wall in accordance with an embodiment.
Figure 24:
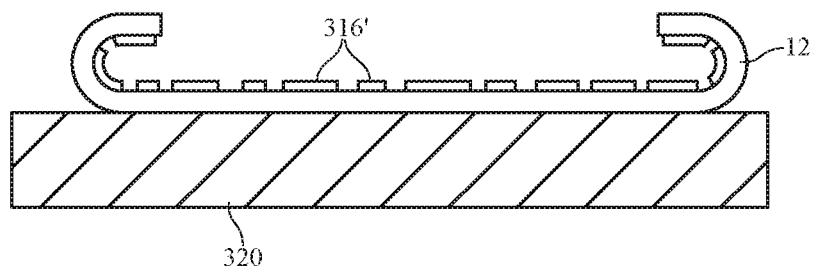

If desired, display layer 46 and/or touch sensor layer 32 may be deposited and patterned as coating layers on the inner surface of wall 12, as shown in FIG. 23 (in which deposition and patterning equipment 314 is depositing and patterning layer 316) and FIG. 24 in which patterning of layer 316 is complete and patterned layer 316' (e.g., a touch and/or display layer) is present on the planar and curved inner surfaces of wall 12.

Figure 25:
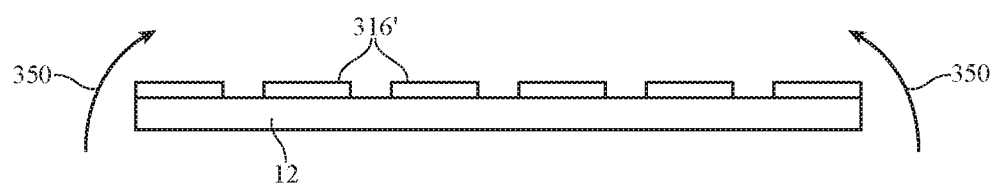
FIGS. 25 and 26 are cross-sectional side views of an illustrative electronic device during fabrication operations in which structures for a display and/or touch sensor are being fabricated in a planar configuration and then bent to form a wall with curved end portions in accordance with an embodiment.
Figure 26:
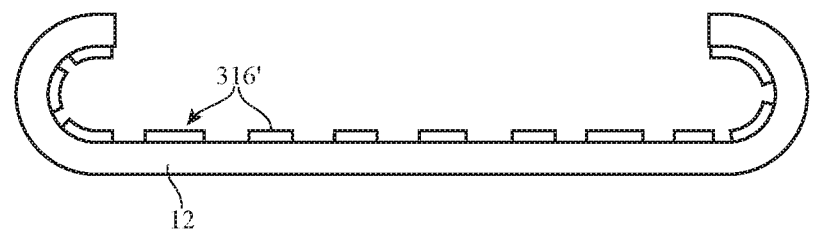

In the illustrative arrangement of FIGS. 25 and 26, touch sensor and/or display layer structures such as structures 316' are deposited and patterned on the surface of wall 12 (FIG. 25) before wall 12 is molded or otherwise formed into its final shape by bending the ends of wall 12. Following bending of the ends of wall 12 in directions 350, wall 12 may have curved sidewall portions as shown in FIG. 26.

Figure 27:
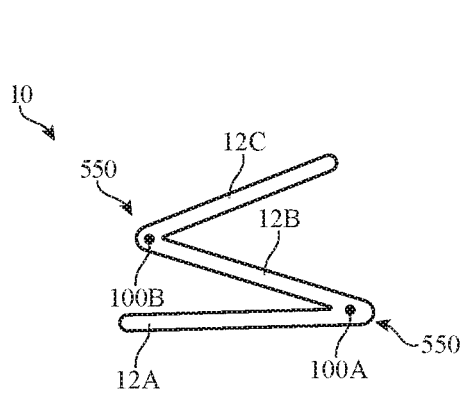
FIG. 27 is a cross-sectional side view of an illustrative electronic device with two flexible portions to allow the device to fold along two respective bend axes in accordance with an embodiment.
Figure 28:
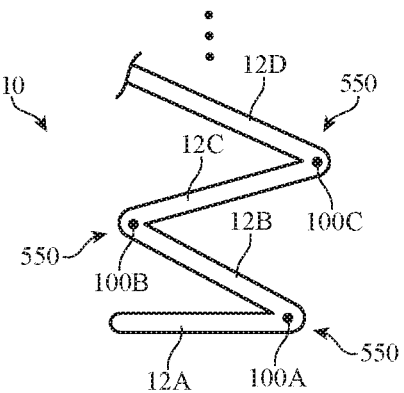
FIG. 28 is a cross-sectional side view of an illustrative electronic device with three or more flexible portions to allow the device to fold along three or more respective bend axes in accordance with an embodiment.

As shown in FIG. 27, electronic device 10 may have two flexible portions 550 to allow device 10 to fold along two respective bend axes 100A and 100B (e.g., to allow device 10 to be placed in an open position, a closed position, and one or more intermediate positions). As shown in FIG. 28, electronic device 10 may have three or more flexible portions 550 that allow device 10 to fold along three or more respective bend axes 100A, 100B, 100C . . . . (e.g., to allow device 10 to be placed in an open position, a closed position, and one or more intermediate positions). In general, device 10 may have any suitable number of hinge regions that allow device 10 to flex. Some or all of the exposed external layers of display 14 in devices such as these may be provided with layers for displays 14 and/or touch sensors 32 (e.g., a device with opposing front and rear surfaces covered with display and/or touch layers may have no hinges, one hinge, two hinges, three hinges, four or more hinges, etc.).

The flexible regions in device 10 may be provided with hinges based on flexible layers of material (e.g., flexible plastic, flexible metal, etc.), accordion (bellows) structures, pivoting hinge structures, and/or other suitable flexible structures.

Figure 29:
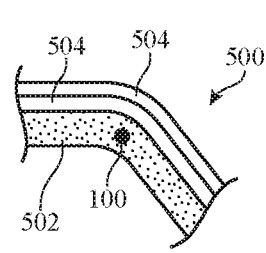
FIG. 29 is a cross-sectional side view of a flexible electronic device hinge region having flexible layers of material that form a hinge in accordance with an embodiment.

In the illustrative configuration of FIG. 29, hinge 500 has been formed from flexible layer 502 (e.g., a flexible core layer of an elastomeric material, a flexible foam, a flexible polymer layer, a flexible metal layer, and/or other flexible layers) that has been covered with one or more layers of material 504 for forming displays 14 and/or touch sensors 32. Layers 504 may be formed one or both sides of device 10. Hinges such as hinge 500 may allow device 10 to bend around bend axis 100.

Figure 30:
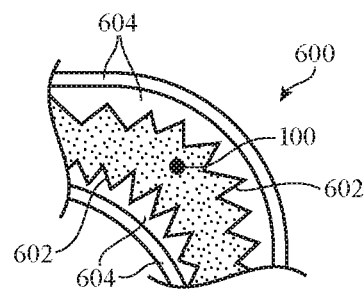
FIG. 30 is a cross-sectional side view of a flexible electronic device hinge region having a flexible accordion structure in accordance with an embodiment.

FIG. 30 shows how hinge 600 may be formed from flexible accordion (bellows) structures 602. One or more flexible layers 604 for displays 14 and/or touch sensors 32 may be formed on the upper and/or lower surfaces of hinge 600. Accordion structures 602 may be formed from metal, plastic, or other materials that are sufficiently thin and flexible to allow the accordion structure to bend. Hinges such as hinge 600 may allow device 10 to bend around bend axis 100.

Figure 31:
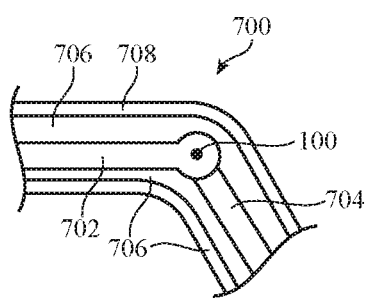
FIG. 31 is a cross-sectional side view of a flexible electronic device hinge region having mating structural members that rotate with respect to each other about a pivot structure such as a pin to form a hinge in accordance with an embodiment.

In the example of FIG. 31, hinge 700 has been formed from a first structural member (member 702) that is coupled to a second structural member (member 704) by a pivot structure such as a pin and mating opening into which the pin protrudes. This allows hinge 700 to flex about bend axis 100.

Other structures that flex with respect to each other may be used to form hinges for device 10. The examples of FIGS. 29, 30, and 31 are merely illustrative.

To help prevent display and touch sensor structures in the flexible layers of device 10 from cracking or otherwise developing faults due to stresses induced by bending device 10, these structures may be provided with stress tolerant features such as locally thinned substrate layers, serpentine metal traces that resist cracking when bent, neutral stress plane adjustments layers such as layers of polymer that can be applied as coatings in bending regions to help move the neutral stress plane of bent material into alignment with metal traces in the bending regions and thereby reduce bend-induced stresses and faults, redundant lines (e.g., stacked metal layers coupled by vias, side-by-side redundant lines, etc.), conductive paths formed from carbon nanotubes, metal paint, and/or other materials that resist cracking when bent, and/or other structures that help the flexible layers of device 10 resist damage during bending.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
    an enclosure having opposing front and rear walls and curved sidewalls;
    touch sensor structures that are overlapped by the front and rear walls so that the touch sensor structures gather touch input on the front wall and gather touch input on the rear wall; and
    displays structures that are overlapped by the front wall and at least a portion of the curved sidewalls, wherein the display structures comprise a display layer having an edge, wherein the touch sensor structures comprise a touch sensor layer, wherein the touch sensor layer comprises a first portion that overlaps the display layer and a second portion that extends beyond the edge of the display layer, and wherein the second portion of the touch sensor layer gathers the touch input on an opaque portion of the curved sidewalls.

2. The electronic device defined in claim 1 wherein the touch sensor structures are overlapped by at least part of the curved sidewalls so that the touch sensor structures gather touch input on the curved sidewalls.

3. The electronic device defined in claim 2 wherein the curved sidewalls include opposing left and right sidewalls and wherein the touch sensor layer extends under the front wall and has edges that extend under at least part of the left and right sidewalls.

4. The electronic device defined in claim 3 wherein the front wall and the part of the left and right sidewalls under which the edges of the touch sensor layer extend form an integral structure.

5. The electronic device defined in claim 4 wherein the integral structure is a layer of transparent material with curved edges forming the part of the left and right sidewalls under which the edges of the touch sensor layer extend.

6. The electronic device defined in claim 5 wherein the layer of transparent material comprises a layer of material selected from the group consisting of: glass and sapphire.

7. The electronic device defined in claim 5 wherein the layer of transparent material comprises a layer of plastic.

8. The electronic device defined in claim 7 further comprising an inorganic coating layer on the layer of plastic.

9. The electronic device defined in claim 1 wherein the front wall and the curved sidewalls are formed from a unitary layer of glass.

10. The electronic device defined in claim 1 wherein the front wall and the curved sidewalls are formed from a unitary layer of plastic.

11. The electronic device defined in claim 1 wherein the front wall and the curved sidewalls are formed from a unitary layer of sapphire.

12. An electronic device that is operable in open and folded configurations, comprising:
    an enclosure having first and second planar walls, first and second curved sidewalls, a flexible wall that lies between the first and second planar walls, and third and fourth planar walls, wherein the third and fourth planar walls are located on an exterior surface of the electronic device when the electronic device is in the folded configuration;
    a first set of components interposed between the first planar wall and the third planar wall;
    a second set of components interposed between the second planar wall and the fourth planar wall;
    a display layer and a touch sensor layer that are both overlapped by the first and second planar walls and by the flexible wall, wherein the display layer extends under the first and second curved sidewalls; and
    touch sensor structures that are interposed between the third and fourth planar walls when the electronic device is in the folded configuration, wherein the touch sensor structures gather touch sensor input through at least one of the third and fourth planar walls.

13. The electronic device defined in claim 12 wherein the first and second planar walls and the flexible wall are formed from transparent plastic and wherein the display layer comprises a flexible polymer substrate.

14. The electronic device defined in claim 12 wherein the touch sensor structures extend under both the third and fourth walls.

15. The electronic device defined in claim 14 wherein the third and fourth walls are opaque.

16. The electronic device defined in claim 12 wherein the first planar wall extends between the flexible wall and the first curved sidewall.

17. The electronic device defined in claim 16 wherein the second planar wall extends between the flexible wall and the second curved sidewall and wherein the touch sensor layer extends under the first and second curved sidewalls.

18. The electronic device defined in claim 17 wherein the touch sensor structures extend under the third and fourth walls and receive touch input under the third and fourth walls.

19. The electronic device defined in claim 12 further comprising fifth and sixth planar walls and an additional flexible wall that lies between the second and fifth planar walls.

20. The electronic device defined in claim 19 wherein the display layer and the touch sensor layer are both overlapped by the fifth planar wall and the additional flexible wall.

21. The electronic device defined in claim 12 wherein the display layer and the touch sensor layer that are overlapped by the first and second planar walls are configured to face away from each other during operations in the folded configuration.

22. The electronic device defined in claim 12 further comprising:
    fifth and sixth planar walls and a first additional flexible wall that lies between the second and fifth planar walls; and seventh and eighth planar walls and a second additional flexible wall that lies between the fifth and seventh planar walls.

23. The electronic device defined in claim 22 wherein the display layer and the touch sensor layer are both overlapped by the fifth planar wall, the first additional flexible wall, the seventh planar wall, and the second additional flexible wall.

24. An electronic device, comprising:
an enclosure having a transparent planar front wall with integral extending transparent edge portions that form at least part of opposing left and right sidewalls and having an opaque planar rear wall opposing the transparent planar front wall, wherein the left and right sidewalls each have opposing inner and outer surfaces;
flexible display and touch sensor layers formed under the transparent planar front wall and the transparent edge portions, wherein the flexible display layer has first and second opposing edges and wherein the touch sensor layer has a first portion that extends beyond the first edge and overlaps the inner and outer surfaces of the left sidewall and a second portion that extends beyond the second edge and overlaps the inner and outer surfaces of the right sidewall; and
a touch sensor under the opaque planar rear wall, wherein the opaque planar rear wall forms an exterior surface of the electronic device.

25. The electronic device defined in claim 24 wherein the flexible display and touch sensor layers include an organic light-emitting diode display layer and a transparent capacitive touch sensor layer interposed between the organic light-emitting diode display layer and the transparent planar front wall with integral extending transparent edge portions.

26. The electronic device defined in claim 25 wherein the transparent planar front wall with integral extending transparent edge portions is a glass layer with curved edge portions forming the opposing left and right sidewalls.

27. The electronic device defined in claim 26 wherein the opposing left and right sidewalls are transparent and have curved profiles that extend between transparent planar front wall and the opaque planar rear wall.

* * * * *